(12) United States Patent
Nguyen

(10) Patent No.: US 6,899,109 B1
(45) Date of Patent: May 31, 2005

(54) METHOD AND APPARATUS FOR REDUCING HE BACKSIDE FAULTS DURING WAFER PROCESSING

(75) Inventor: Thomas D. Nguyen, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/802,647

(22) Filed: Mar. 16, 2004

Related U.S. Application Data

(62) Division of application No. 09/747,703, filed on Dec. 21, 2000, now Pat. No. 6,733,594.

(51) Int. Cl.$^7$ .................................. B08B 3/00
(52) U.S. Cl. ............... 134/61; 156/345.31; 156/345.32; 156/345.51; 15/21.1
(58) Field of Search ................ 134/61; 156/345.31, 156/345.32, 345.51; 15/21.1

(56) References Cited

U.S. PATENT DOCUMENTS

| | | | |
|---|---|---|---|
| 5,135,608 A | * | 8/1992 | Okutani ..................... 438/584 |
| 5,310,453 A | | 5/1994 | Fukasawa et al. |
| 5,780,204 A | | 7/1998 | La et al. |
| 5,913,979 A | | 6/1999 | Shen et al. |
| 5,958,796 A | | 9/1999 | Prall et al. |
| 5,966,635 A | | 10/1999 | Hiatt et al. |
| 6,035,871 A | * | 3/2000 | Eui-Yeol ..................... 134/61 |
| 6,136,510 A | | 10/2000 | La et al. |
| 6,136,725 A | | 10/2000 | Loan et al. |
| 6,152,148 A | | 11/2000 | George et al. |
| 6,251,759 B1 | | 6/2001 | Guo et al. |
| 6,312,525 B1 | | 11/2001 | Bright et al. |
| 6,348,420 B1 | | 2/2002 | Raaijmakers et al. |
| 6,372,301 B1 | | 4/2002 | Narasimhan et al. |
| 6,413,321 B1 | | 7/2002 | Kim et al. |
| 2001/0010103 A1 | * | 8/2001 | Konishi et al. ................ 15/77 |

* cited by examiner

*Primary Examiner*—M. Kornakov
(74) *Attorney, Agent, or Firm*—Beyer Weaver & Thomas, LLP

(57) ABSTRACT

A system for processing a wafer includes a cleaning module configured to only clean the back side of the wafer so as to remove unwanted particles therefrom before performing subsequent processing tasks on the process side of the wafer. The system also includes a processing module configured to perform processing tasks on the process side of the wafer. The processing module includes a chuck for supporting the wafer during the processing task. The system further includes a transport module configured to remove the cleaned wafer from the cleaning module, move it to the processing module and place it on the chuck of the processing module without performing any intervening manipulations during the movement.

27 Claims, 8 Drawing Sheets

METHOD AND APPARATUS FOR REDUCING HE BACKSIDE FAULTS DURING WAFER PROCESSING

CROSS REFERENCE TO RELATED APPLICATIONS

The present application is a divisional application of U.S. application Ser. No. 09/747,703, filed Dec. 21, 2000 now U.S. Pat. No. 6,733,594 which is incorporated by reference herein in its entirety.

BACKGROUND OF THE INVENTION

The present invention relates to apparatus and methods for processing substrates such as semiconductor substrates for use in IC fabrication or glass panels for use in flat panel display applications. More particularly, the present invention relates to improved techniques for reducing He backside faults during wafer processing.

FIG. 1A illustrates a typical processing module 100 for processing a wafer 112. The processing module 100 generally includes a chamber 114 within which processing takes place, and a chuck 116 for holding the wafer 112 during processing. The processing module 100 also includes a gas inlet port 118 for releasing gaseous source materials, i.e., etchants, into the chamber 114, and a gas exhaust port 120 for exhausting by-product gases formed during processing. The exhaust port 120 is typically coupled to a pump (not shown) that maintains the appropriate pressure inside chamber 114.

The chuck 116 also includes a heat transfer system 122 for controlling the temperature (e.g., cooling) of the wafer 112 during processing. As shown, the heat transfer system 122 is generally configured for distributing He gas to a backside 113 of the wafer 112. In most cases, the heat transfer system 122 includes a mass flow controller 124, a main channel 126, and a plurality of outlet channels 128. The mass flow controller 124 delivers He gas (under pressure) to the main channel 126 and the main channel 126 distributes the He gas to the plurality of outlet channels 128, which then distributes the He gas to the backside 113 of the wafer 112. The He gas then exits out the side of the chuck 116 (as shown by arrow 129) where it is exhausted through exhaust port 120. As should be appreciated, the He gas acts as a heat transfer medium for accurately controlling the temperature of the wafer 112 during processing so as to ensure uniform and repeatable processing results.

A pressure sensor 132 and a controller 134 is also provided to continuously monitor the pressure of the He gas, and adjust the mass flow controller 124 accordingly. For example, the controller 134, via a measurement signal from the pressure sensor 132, generally sends a command signal to the mass flow controller 124 to adjust the He flow so as to maintain a set point pressure at the backside of the wafer 112. In most cases, the set point pressure is maintained throughout a processing task, however, in some cases an He backside fault may be formed when the pressure is too low and/or the flow rate is too high (e.g., base on predetermined limits). By way of example, an He backside fault may occur when an excessive amount of He gas flows out the side of the chuck 116. The He backside fault is typically formed to stop processing so as to prevent undesirable and/or unpredictable gas pressures and gas chemistries from forming in the chamber 114. As should be appreciated, undesirable and/or unpredictable gas pressures and gas chemistries may lead to process drift and/or process failure.

He backside faults, which are caused by excessive He flow, generally occur when the backside of the wafer does not seat properly on the top surface of the chuck, i.e., the backside of the wafer is offset or de-chucked relative to the top surface of the chuck. By way of example, a gap may be formed between the wafer backside and the chuck top surface allowing a greater amount of He gas to escape. As should be appreciated, the escaping gas tends to cause the pressure to decrease and thus the mass flow controller (via the pressure sensor and controller) increases the flow rate of the outputted He gas. It has generally been found that gaps are formed when the wafer is warped or when particles are trapped between the chuck and the wafer. With regards to trapped particles, the particles may be dust, polymer deposits and/or excess photo-resist that has accumulated or collected on the backside of the wafer and/or top surface of the chuck during prior processing steps and/or transfers.

To facilitate discussion, FIG. 1B illustrates the processing module 100 with a gap 136 formed between the bottom side 113 of the wafer 112 and the top surface 117 of the chuck 116. By way of example, the gap 136 may be formed when a particle 138 is trapped between the bottom side 113 of the wafer 112 and the top surface 117 of the chuck 116. As shown, the particle 138 does not allow the wafer 112 to sit flat. In most cases, the gap 136 tends to cause the He gas to escape more readily thus creating excessive He flow (shown by the larger arrow 139). As should be appreciated, the excessive He flow tends to trigger He backside faults.

Conventional methods for overcoming the He backside faults have included clearing the alarm and resuming processing, removing the wafer from the processing module and reprocessing it in the same module at a later time, removing the wafer from the processing module and reprocessing it in a different module at a later time, and/or removing the wafer from the processing module and determining what is causing the error, i.e., polymer deposits, warp, dust, etc. In the later method, if it is determined that dust was the culprit, then the wafer may be cleaned in a water based solution and reprocessed in the same or a different module. If it is determined that photo-resist or polymer deposits are the culprit, then the entire wafer may be stripped in a solvent solution and re-patterned before reprocessing it in the same or a different module.

Unfortunately, however, He backside faults, as well as the aforementioned methods, stop the processing module from continuously running and thus a significant amount of tool downtime may be created. As should be appreciated, downtime leads to a loss in productivity and thus increased costs. For example, the He backside faults may prevent an entire wafer lot from completing that particular processing step and steps that may occur thereafter. By way of example, it may take an operator about 0.25 hours to about 1 hour to clear an He backside fault alarm. In addition, it may take an operator about 0.25 hours to about 2 hours to resume processing or to remove the wafer from the processing module. Further, it may take about 0.5 hours to about 48 hours to make determination of the problem, clean the wafer, re-pattern the wafer and/or reprocess the wafer.

In view of the foregoing, there are desired improved techniques for reducing He backside faults during wafer processing.

SUMMARY OF THE INVENTION

The invention relates, in one embodiment, to a method of processing a wafer. The method includes receiving a wafer having a process side and a backside. The method further includes removing un-wanted particles from the backside of the wafer. The method also includes performing a specific processing task on the process side of the wafer after cleaning the backside of the wafer. In most embodiments, the unwanted particles are removed from the backside of the wafer to prevent gaps from forming between the backside of the wafer and a chucking surface.

The invention relates, in another embodiment, to a method of processing a wafer having a process side and a backside opposite the process side. The method includes providing a cleaning module for cleaning the backside of the wafer and a processing module for performing a processing task on the process side of the wafer. The method further includes receiving a wafer for processing. The method additionally includes loading the wafer into the cleaning module and cleaning the backside of the wafer to remove particles therefrom. The method also includes transferring the wafer to the processing module. The method further includes loading the wafer into the processing module and performing the processing task on the process side of the wafer.

The invention relates, in another embodiment, to a system for reducing He backside faults when processing a wafer having a process side and a backside opposite the process side. The system includes a cleaning module for cleaning the backside of the wafer so as to remove un-wanted particles therefrom before performing subsequent processing tasks on the process side of the wafer. The system also includes a processing module for performing processing tasks on the process side of the wafer after the un-wanted particles have been removed from the backside of the wafer.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

The invention generally pertains to improved techniques for reducing He flow faults during wafer processing. Broadly, the invention relates to removing particles from the backside of the wafer before performing a specific processing task on the process side of the wafer. More specifically, the invention relates to cleaning the backside of the wafer to remove particles stuck thereto during the wafer process flow and prior to loading the wafer into a processing module, and more particularly prior to placing the wafer a chuck. By cleaning the backside of the wafer before placing the wafer on the chuck, the desired relationship between the backside of the wafer and the top surface of the chuck can be maintained. That is, the backside of the wafer may sit flat on the top surface of the chuck without forming gaps therebetween.

Accordingly, He backside faults, which are typically induced by gaps formed from particles stuck on the backside of the wafer, may be substantially eliminated, and as a result downtime associated with the He backside faults may be substantially reduced. That is, the processing module may continuously run without He flow errors and thus the processing module may not have to be shut down. Even further, the entire process may continuously operate without interruption thus allowing a wafer lot (e.g., a plurality of wafers) to be completed without long delays due to He flow faults.

Embodiments of the invention are discussed below with reference to FIGS. 2–8. However, those skilled in the art will readily appreciate that the detailed description given herein with respect to these figures is for explanatory purposes as the invention extends beyond these limited embodiments.

Figure 1A:
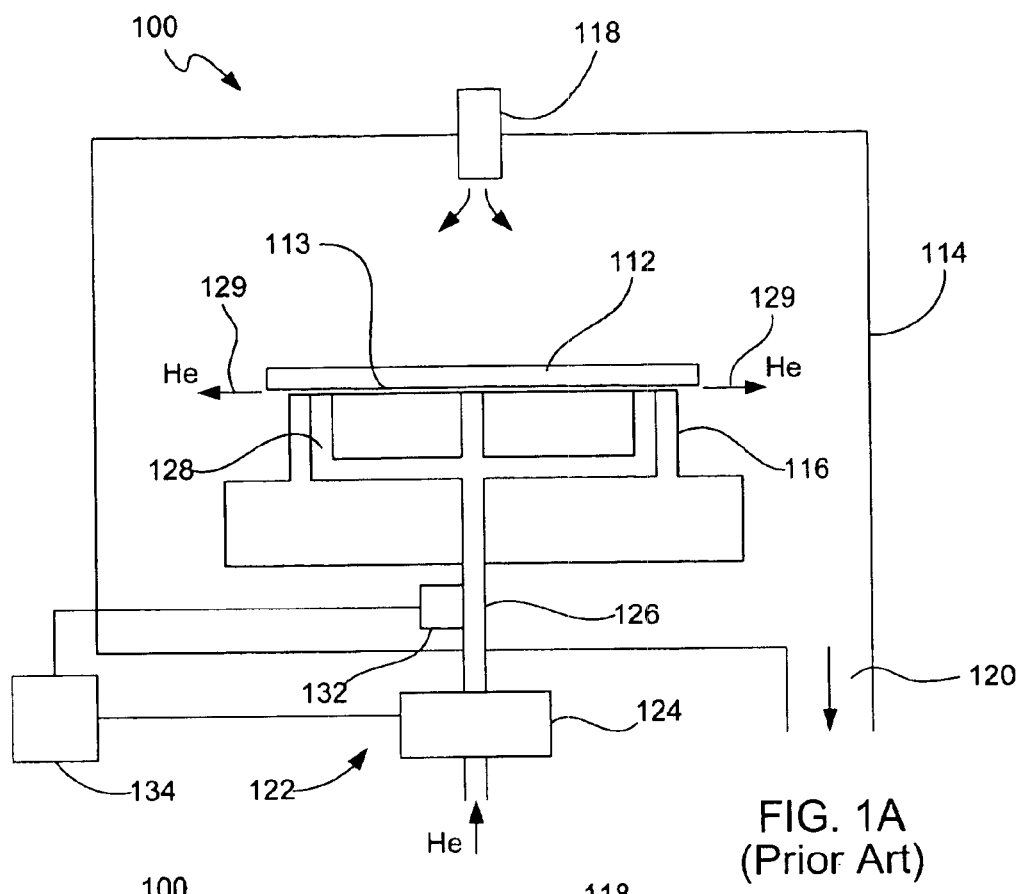
FIG. 1A illustrates an exemplary processing module.
Figure 1B:
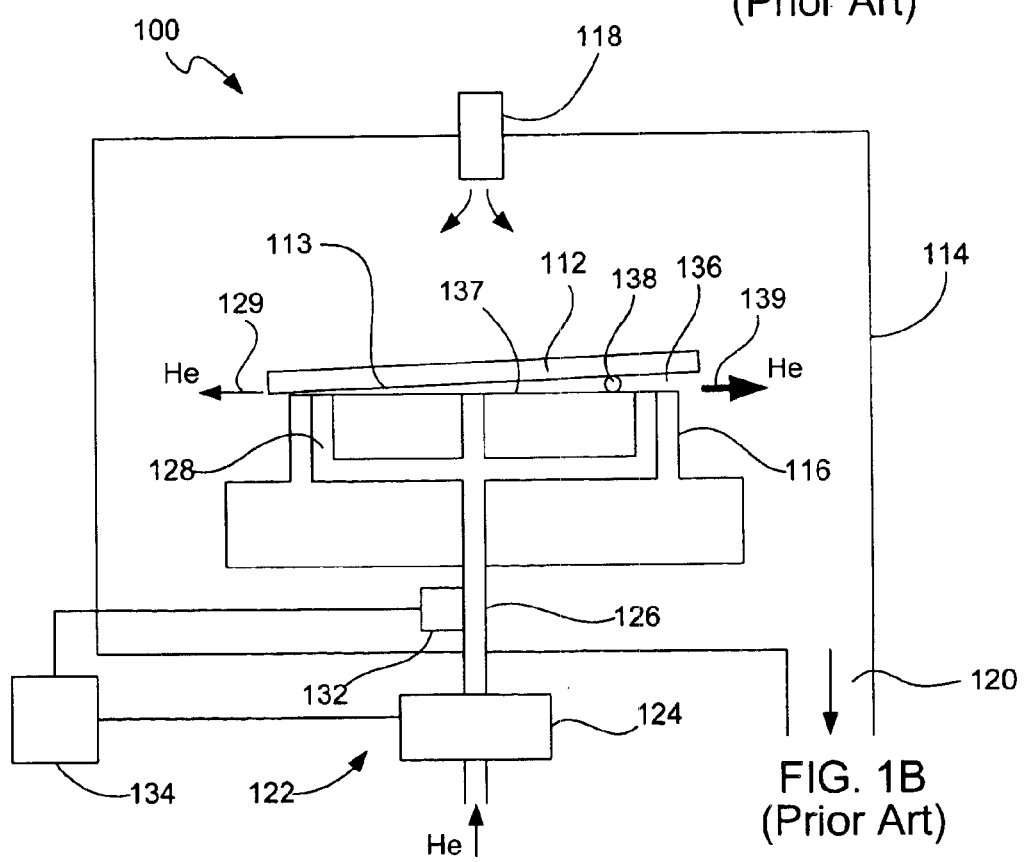
FIG. 1B illustrates an exemplary processing module with a gap formed between the bottom side of the wafer and the top surface of the chuck.
Figure 2:
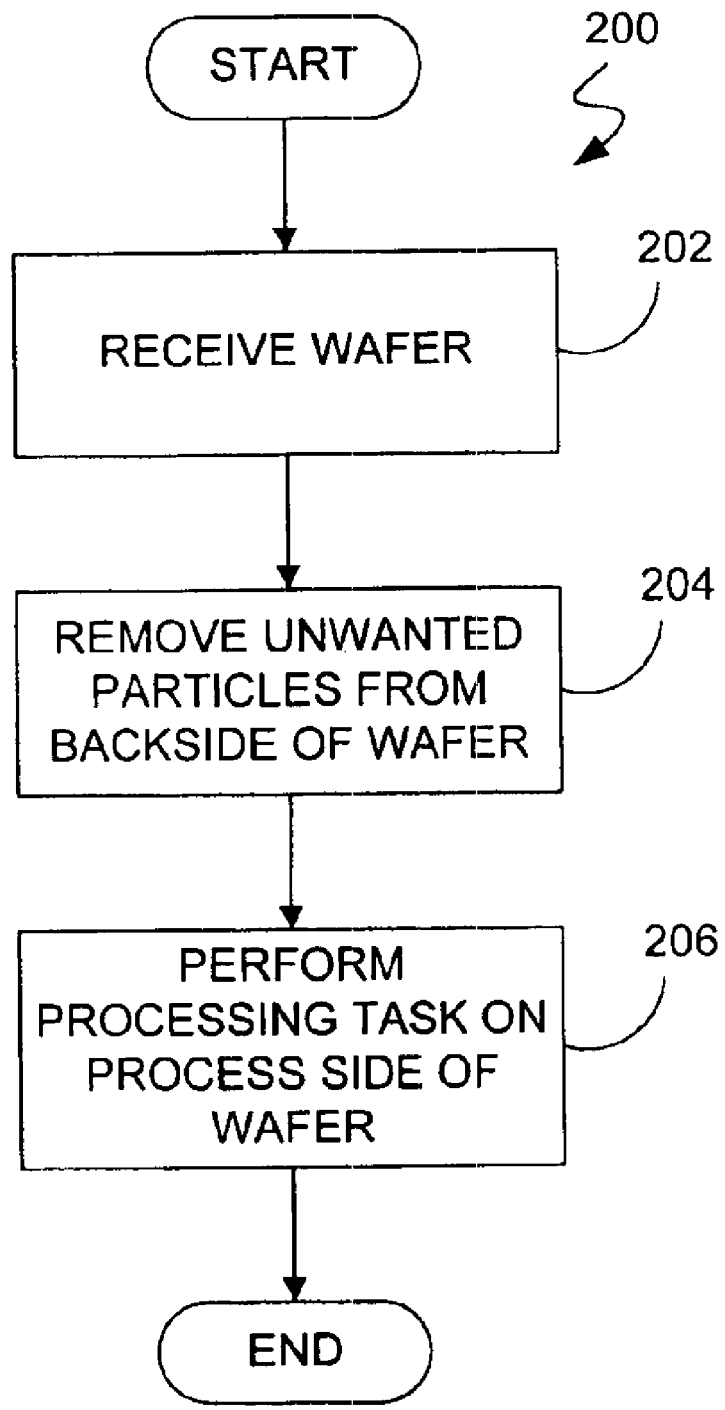
FIG. 2 is a flow diagram illustrating a wafer processing procedure, in accordance with one embodiment of the present invention.

FIG. 2 is a flow diagram illustrating a wafer processing procedure 200, in accordance with one embodiment of the present invention. The procedure 200 begins at step 202 where a wafer is received by an operator or by a machine. The wafer is generally received for a specific processing task (e.g., step 206). By specific processing task, it is meant that the processing task is the next task in a sequence of tasks used to process the wafer. The wafer may be a raw wafer or a previously processed wafer. By definition, a raw wafer is a wafer that has not yet been processed. For example, the wafer may have an unprocessed surface on the process side of the wafer. On the other hand, a previously processed wafer is a wafer that has already been processed. For example, the wafer may have dielectric layers, conductive layers, masking layers and/or the like formed on the process side of the wafer. Etching, deposition, and/or patterning are some of the methods used for forming layers on the process side of the wafer. As is generally well known, the backside of the wafer, which is opposite the process side of the wafer, is typically left raw. In most cases, the backside of the wafer is arranged for resting on a top surface of a chuck, which is configured for holding the wafer during processing.

After receiving the wafer, the process flow proceeds to step 204 where unwanted particles are removed from the backside of the wafer. The unwanted particles may be dust collected during wafer transfer and/or deposits such as remnants of patterned material or by-products formed during previous processing steps. The unwanted particles typically stick to the backside of the wafer via static force, molecular bonds and the like. As mentioned, the unwanted particles may cause problems during subsequent processing steps. For example, the unwanted particles may cause the wafer to be tilted or off set relative to a chuck and thus they may cause He backside faults.

In one embodiment, the unwanted particles are removed by cleaning the backside of the wafer. In most cases, only the backside is cleaned so as not to damage or contaminate the process side of the wafer. By way of example, the backside of the wafer may be cleaned in a dry cleaning process, a semi-dry cleaning process, and/or a wet cleaning process. In the dry cleaning process, a gaseous cleaning agent or reactant is generally introduced into a process chamber, wherein the reactants chemically react with and vaporize the deposits on the backside of the wafer. The vaporized deposits (volatile) are then pumped out of the chamber. In the semi-dry cleaning process, an alcohol or water based solution is aggressively applied to the backside of the wafer so as to wash away (e.g., collect) dust and/or deposits that are stuck to the backside of the wafer. In the wet cleaning process, a solvent arranged for chemically attacking the deposits (e.g., photoresist) is applied to the backside of the wafer to chemically remove deposits therefrom. Dry cleaning and semi-dry cleaning are generally preferred over wet cleaning because of the chemically aggressive nature of the solvents used in wet cleaning, i.e., do not want to damage the process side of the wafer. In most situations, the entire backside of the wafer is cleaned. However, in other cases, only a portion of the wafer is cleaned.

After the unwanted particles have been removed from the backside of the wafer, the process flow proceeds to step 206 where a processing task is performed on the process side of the wafer. As should be appreciated, the He flow error is substantially prevented from occurring during step 206 by removing the particles prior to beginning step 206. That is, the He flow error is substantially eliminated before it has a chance to occur. Generally speaking, the wafer is loaded into a process chamber, and placed on a chuck inside the process chamber before beginning the processing task (but after the particle removal step). In most cases, the processing task is a specific processing step that is conducted in a sequence of processing steps for the first time, i.e., not reprocessed. By way of example, the processing task may include etching, deposition, or some form of patterning. These steps are readily understood by those skilled in the art and for the sake of brevity will not be discussed in greater detail.

Figure 3:
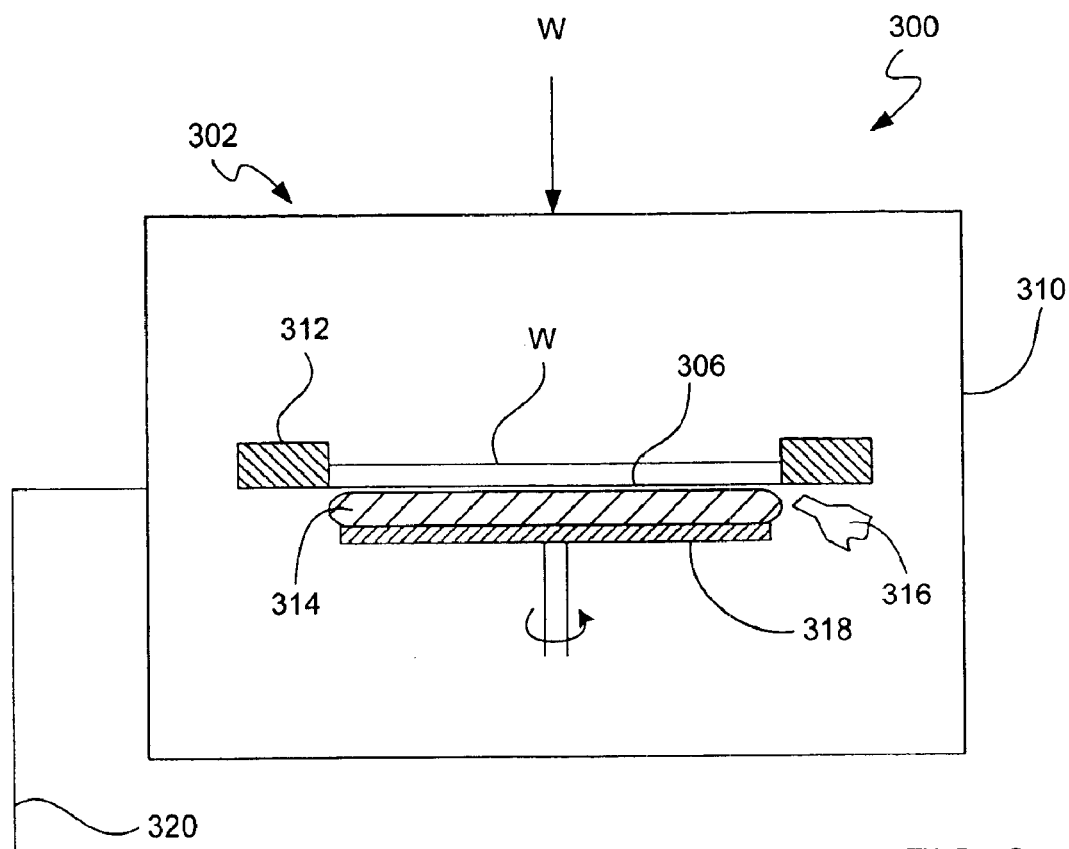
FIG. 3 is a schematic diagram of a wafer processing system, in accordance with one embodiment of the present invention.
Figure 3:
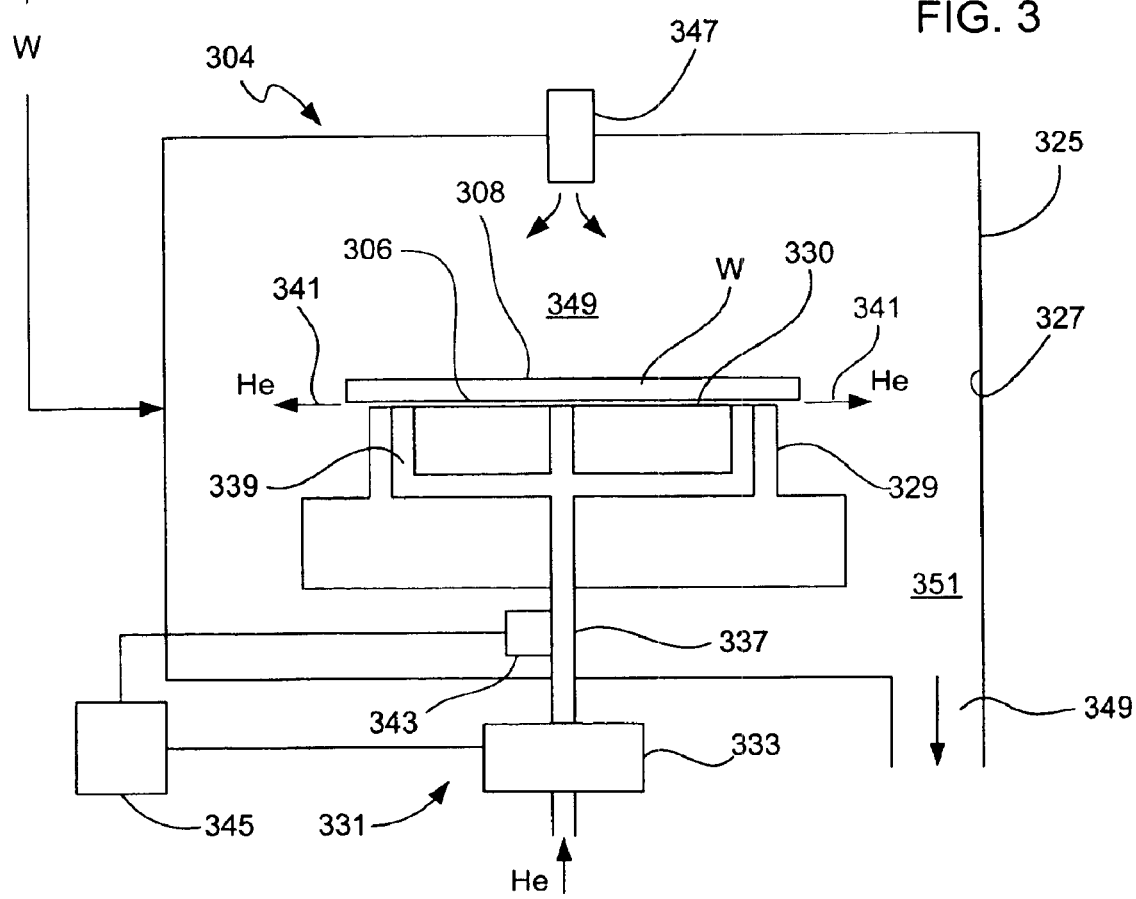

FIG. 3 is a schematic diagram of a wafer processing system 300 for processing a wafer W, in accordance with one embodiment of the present invention. As should be appreciated, wafer W represents the work-piece to be processed, which may represent, for example, a semiconductor substrate to be etched, deposited, or otherwise processed or a glass panel to be processed into a flat panel display. The wafer processing system 300 generally includes a cleaning module 302 and a processing module 304. The cleaning module 302 is generally arranged for cleaning a backside 306 of the wafer W. By cleaning the backside 306, unwanted particles that have adhered to the bottom surface of the wafer W can be removed. As mentioned, the unwanted particles may be dust collected during wafer transfer and/or deposits such as remnants of patterned material or by-products formed during previous processing steps.

In the illustrated embodiment, the cleaning module 302 includes a cleaning chamber 310, a wafer holder 312, a cleaning brush 314, an applicator 316, and a platen 318. The wafer holder 312 is arranged for holding the backside 306 of the wafer W relative to the cleaning brush 314, and the platen 318 is arranged for holding the cleaning brush 314 relative to the backside 306 of the wafer W. In most cases, the wafer holder 312 holds the wafer W against the cleaning brush 314. However, in some cases, the platen 318 may hold the cleaning brush 314 against the wafer W. The cleaning brush 314 is configured for scrubbing the backside 306 of the wafer W so as to remove the unwanted particles from the backside 306 of the wafer W. As such, the cleaning brush 314 generally has a certain degree of "abrasiveness". As should be appreciated, the amount of "abrasiveness" presents a design challenge—the desirability of removing the unwanted particles, and the desirability of maintaining the backside of the wafer, i.e., not adversely altering the backside of the wafer. For example, a highly abrasive brush may have the adverse affect of removing portions of the wafer, and a non-abrasive brush may have the adverse affect of not removing the unwanted particles.

Furthermore, the applicator 316 is arranged for dispensing a cleaning solution on the backside 306 of the wafer W. In most cases, the cleaning solution is applied to the brush 314. However, in some situations, the cleaning solution may be applied directly to the backside 306 of the wafer W. In this situation, a high pressure applicator, arranged for dispensing a high pressure cleaning solution, may be used along with or in place of the brush to aggressively remove the unwanted particles. By way of example, the cleaning solution may be an alcohol-based solution or a waterbased solution.

In general, the brush 314 and the wafer W move relative to one another so as to force unwanted particles off of the backside 306 of the wafer W. In some embodiments, the wafer W is held stationary while the brush 314 is moved, and in other embodiments, the brush 314 is held stationary while the wafer W is moved. In yet other embodiments, both the brush 314 and the wafer W are moved together. In one embodiment, the brush 314 is rotated relative to the wafer W. In another embodiment, the wafer W is rotated relative to the brush 314. Further, in some embodiments, the brush 314 is arranged to cover the backside 306 in its entirety (as shown), and in other embodiments the brush 314 is configured to cover only a portion of the backside 306. In the later embodiment, the brush 314 may be arranged to move in an orbital motion or linearly from the center of the wafer W to the outer edge of the wafer W so as to clean the entire backside 306 of the wafer W.

In the illustrated embodiment, the method for cleaning the backside 306 of the wafer W generally involves loading the wafer W into the cleaning chamber 310, mounting the wafer W to the wafer holder 312, positioning the brush 314 against the backside 306 of the wafer W, rotating the brush 314 relative to the wafer W, and flowing the cleaning solution between the backside 306 of the wafer W and the brush 314. As should be appreciated, as the brush 314 is rotated, the cleaning solution interacts with the wafer W and the brush 314 to physically remove the unwanted particles that are forced off of the backside 306 of the wafer W due to the abrasive action of the brush 314. After the backside is rinsed and dried, the wafer W is transferred from the cleaning module 302 to the processing module 304 via a transfer mechanism 320. By way of example, the transfer mechanism 320 may be a transfer robot or an operator.

Referring now to the processing module 304, the processing module 304 is generally arranged for performing processing tasks on a process side 308 of the wafer W. By way of example, the processing module 304 may be arranged for etching, deposition, patterning, and/or the like. The processing module 304 generally includes a process chamber 325, a portion of which is defined by chamber walls 327, and within which processing takes place. In most embodiments, the process chamber 325 is arranged to be substantially cylindrical in shape, and the chamber walls 327 are arranged to be substantially vertical. It should be understood, however, that this is not a limitation and that the process chamber shape and the chamber wall orientation may vary according to the specific design of each processing module. For example, the chamber walls may be sloped or the chamber shape may be rectangular.

In most embodiments, the wafer W is introduced into the process chamber 325 and disposed on a chuck 329 for supporting and holding the wafer W during processing. By way of example, the chuck 329 may be an electrostatic chuck, a vacuum chuck, or a mechanical chuck. As is generally well known, an electrostatic chuck uses electrostatic force to hold the backside 306 of the wafer W relative to a top surface 330 of the chuck 329, a vacuum chuck used vacuum force to hold the backside 306 of the wafer W relative to a top surface 330 of the chuck 329, and a mechanical chuck uses mechanical forces to hold the backside 306 of the wafer W relative to a top surface 330 of the chuck 329. As shown, the cleaning module 302 effectively removed the unwanted particles from the backside 306 of the wafer W and thus the backside 306 of the wafer W sits flat on the top surface 330 of the chuck 329.

In most embodiments, the chuck 329 includes a heat transfer system 331 for controlling the temperature (e.g., cooling) of the wafer W during processing. As shown, the heat transfer system 331 is generally configured for distributing He gas to the backside 306 of the wafer W. In most cases, the heat transfer system 331 includes a mass flow controller 333, a main channel 337, and a plurality of outlet channels 339. The mass flow controller 333 delivers He gas (under pressure) to the main channel 337 and the main channel 337 distributes the He gas to the plurality of outlet channels 339, which then distributes the He gas to the backside 306 of the wafer W. The He gas after passing over the backside 306 of the wafer W then exits out the side of the chuck 329 (as shown by arrow 341). As should be appreciated, the He gas acts as a heat transfer medium for accurately controlling the temperature of the wafer W during processing so as to ensure uniform and repeatable processing results. It should be noted that He gas is not a limitation and that other gases may be used. For example, Nitrogen (N2) gas, Argon gas and/or the like may be used.

A pressure sensor 343 and a controller 345 may also be provided to continuously monitor the pressure of the He gas, and adjust the mass flow controller 333 accordingly. In most cases, the controller 345, via a measurement signal from the pressure sensor 343, sends a command signal to the mass flow controller 333 to adjust the He flow, e.g., 20–35 sccm, so as to maintain a set point pressure between the backside 306 of the wafer W and the chuck 329. Most processing modules stop processing the wafer W if the pressure is too low and/or if the flow rate is too high. In fact, the module may produce a He flow error alarm during these situations to alert an operator to the problem. As should be appreciated, undesirable and/or unpredictable gas pressures may cause process drift and/or process failure.

In addition, a gas injector 347 is typically provided for releasing a gaseous source material or a mixture of gaseous source materials into the process chamber 325, and more particularly the process region 349 between the gas injector and the process side 308 of the wafer W. As shown, the gas injection port 347 is built into the top wall of the process chamber 325. It should also be noted, however, that this is not a limitation and that the placement may vary according to the specific needs of each device. For example, the gas injector 347 may also be built into the sides of the chamber 325. Furthermore, although the gas injector 347 is shown as a single port, it should be appreciated that a shower head arrangement may also be used.

An exhaust port 349 is also provided for exhausting spent gases formed during processing. As shown, the exhaust port 349 is located in an outer region 351 of the process chamber 325 and disposed between the chamber walls 327 and the chuck 329. The exhaust port 349 is generally coupled to a turbomolecular pump (not shown), which is located outside of the process chamber 325, and which is arranged to maintain the appropriate pressure inside the process chamber 325. Furthermore, although the exhaust port is shown disposed between the chamber walls and the chuck, the actual placement of the exhaust port 349 may vary according to the specific design of each processing module. For example, the exhausting of gases may also be accomplished from ports built into the chamber walls. Gas systems that include gas injectors and exhaust ports are well known in the art and for the sake of brevity will not be discussed in anymore detail herein.

Broadly, it is contemplated that the processing module 304 may be adapted for any of a number of suitable and known etching or deposition processes. By way of example, the processing module 304 may be adapted for deposition processes such as chemical vapor deposition (CVD), plasma enhanced chemical vapor deposition (PECVD), physical vapor deposition (PVD) or the like. Furthermore, the processing module 304 may be adapted for etching processes such as those adapted for dry etching, plasma etching, reactive ion etching (RIE), magnetically enhanced reactive ion etching (MERIE), electron cyclotron resonance (ECR), or the like.

More specifically, it is contemplated that the processing module may be adapted for any suitable plasma reactor. Note that this is true irrespective of whether energy to the plasma is delivered through capacitively coupled parallel electrode plates, through ECR microwave plasma sources, or through inductively coupled RF sources such as helicon, helical resonators, and RF antennas (planar or non planar). These types of systems, among others, are readily available commercially. By way of example, capacitively coupled and inductively coupled plasma reactors such as the 4500, 4250, 4250 XL, EXELAN, EXELAN HP, 9100, 2300, 9400, 9500, 9600 and DEFFNIUM machines are readily available from Lam Research Corporation of Fremont, Calif.

Figure 4:
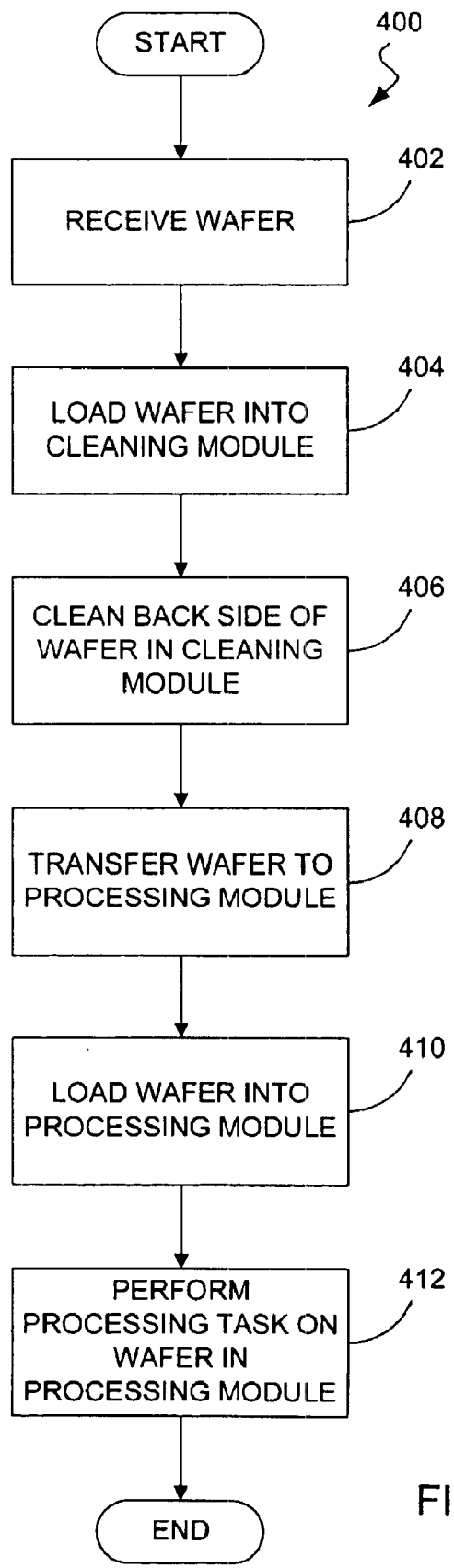
FIG. 4 is a flow diagram illustrating a wafer processing procedure, in accordance with one embodiment of the present invention.

FIG. 4 is a flow diagram illustrating a wafer processing procedure 400, in accordance with one embodiment of the present invention. By way of example, the procedure 400 may be applied to the wafer processing system 300 shown in FIG. 3. The procedure 400 begins at step 402 where a wafer is received by an operator or by a machine. The wafer is generally received for the next processing step (e.g., step 412). The wafer may be a raw wafer or a previously processed wafer. By definition, a raw wafer is a wafer that has not yet been processed. For example, the wafer may have an unprocessed surface on the process side of the wafer. On the other hand, a previously processed wafer is a wafer that has already been processed. For example, the wafer may have dielectric layers, conductive layers, masking layers and/or the like formed on the process side of the wafer. Etching, deposition, and/or patterning are some of the methods used for forming layers on the process side of the wafer. As is generally well known, the backside of the wafer, which is opposite the process side of the wafer, is typically left raw. In most cases, the backside of the wafer is arranged for resting on a top surface of a chuck, which is configured for holding the wafer during processing.

After receiving the wafer, the process flow proceeds to step 404 where the wafer is loaded into a cleaning module. The loading may be accomplished via a transfer robot or an operator. The cleaning module is generally arranged for cleaning the backside of the wafer so as to remove unwanted particles therefrom.

By way of example, the cleaning module may be the cleaning module 302 described in FIG. 3. As such, during this step, the wafer is introduced into the cleaning chamber and positioned on the wafer holder.

After loading the wafer, the process flow proceeds to step 406 where the backside of the wafer is cleaned in the cleaning module. As mentioned, the cleaning module is generally arranged for cleaning the backside of the wafer so as to remove unwanted particles therefrom. The unwanted particles may be dust collected during wafer transfer and/or deposits such as remnants of patterned material or by-products formed during previous processing steps. The unwanted particles typically stick to the backside of the wafer via static force, molecular bonds and the like. As mentioned, the unwanted particles may cause problems during subsequent processing steps. For example, the unwanted particles may cause the wafer to be tilted or off set relative to a chuck and thus they may cause He flow errors. In most cases, only the backside is cleaned so as not to damage or contaminate the process side of the wafer. Further, the entire backside of the wafer may be cleaned or only a portion of the wafer may be cleaned. By way of example, when the wafer is cleaned in the cleaning module described in FIG. 3, the brush is positioned against the backside of the wafer and subsequently rotated relative to the wafer W while the cleaning solution is flowed between the backside of the wafer and the brush.

It should be noted that the cleaning module of FIG. 3 is not a limitation and that other cleaning modules may be used. For example, other semi-dry cleaning modules, as well as dry and/or wet cleaning modules may be used. Dry cleaning and semi-dry cleaning modules are generally preferred over wet cleaning modules because of the chemically aggressive nature of the solvents used in the wet cleaning module, i.e., do not want to damage the process side of the wafer.

After cleaning the backside of the wafer, the process flow proceeds to step 408 where the wafer is transferred to a processing module. Again, the transferring may be accomplished via a transfer robot or an operator.

After transferring the wafer to the process module, the process flow proceeds to step 410 where the wafer is loaded into the processing module. The loading may be accomplished via a transfer robot or an operator. The processing module is generally arranged for performing a process task on the process side of the wafer. By way of example, the processing module 304 described in FIG. 3 may be used. As such, during this step, the wafer is introduced into the process chamber and placed on the chuck. More particularly, the backside of the wafer is positioned on the top surface of the chuck. Subsequently, the chuck via electrostatic, vacuum or mechanical forces clamps the wafer to the chuck.

After loading the wafer, the process flow proceeds to step 412 where the process side of the wafer is processed in the processing module. The processing module may be adapted for etching, deposition, patterning, and/or the like. If the process task includes deposition, then materials such as conductors and dielectrics are deposited onto the process side of the wafer. If the process task includes etching, then materials such as conductors and dielectrics are removed from predefined areas on the process side of the wafer. If the process task includes patterning, then masking materials such as resists are applied to the process side of the wafer. In the case where the processing module is a plasma reactor, a plasma may be ignited and sustained by supplying a gas containing appropriate etchant or deposition source gases into the process chamber and applying energy to those source gases to respectively etch or deposit a layer of material on the process side of the wafer. As should be appreciated, during this process, the wafer begins to heat and thus the heat transfer system actively works to cool the wafer by distributing the heat transfer medium, i.e., He gas, to the backside of the wafer. Accordingly, because the backside was cleaned in a previous step (e.g., step 406), the wafer sits properly on the top surface of the chuck and substantially no He flow errors are encountered during the process task.

It should be noted that the processing module of FIG. 3 is not a limitation and that other processing modules may be used. It should also be noted that plasma reactors are not a limitation and that other types of reactors may be used.

Figure 5:
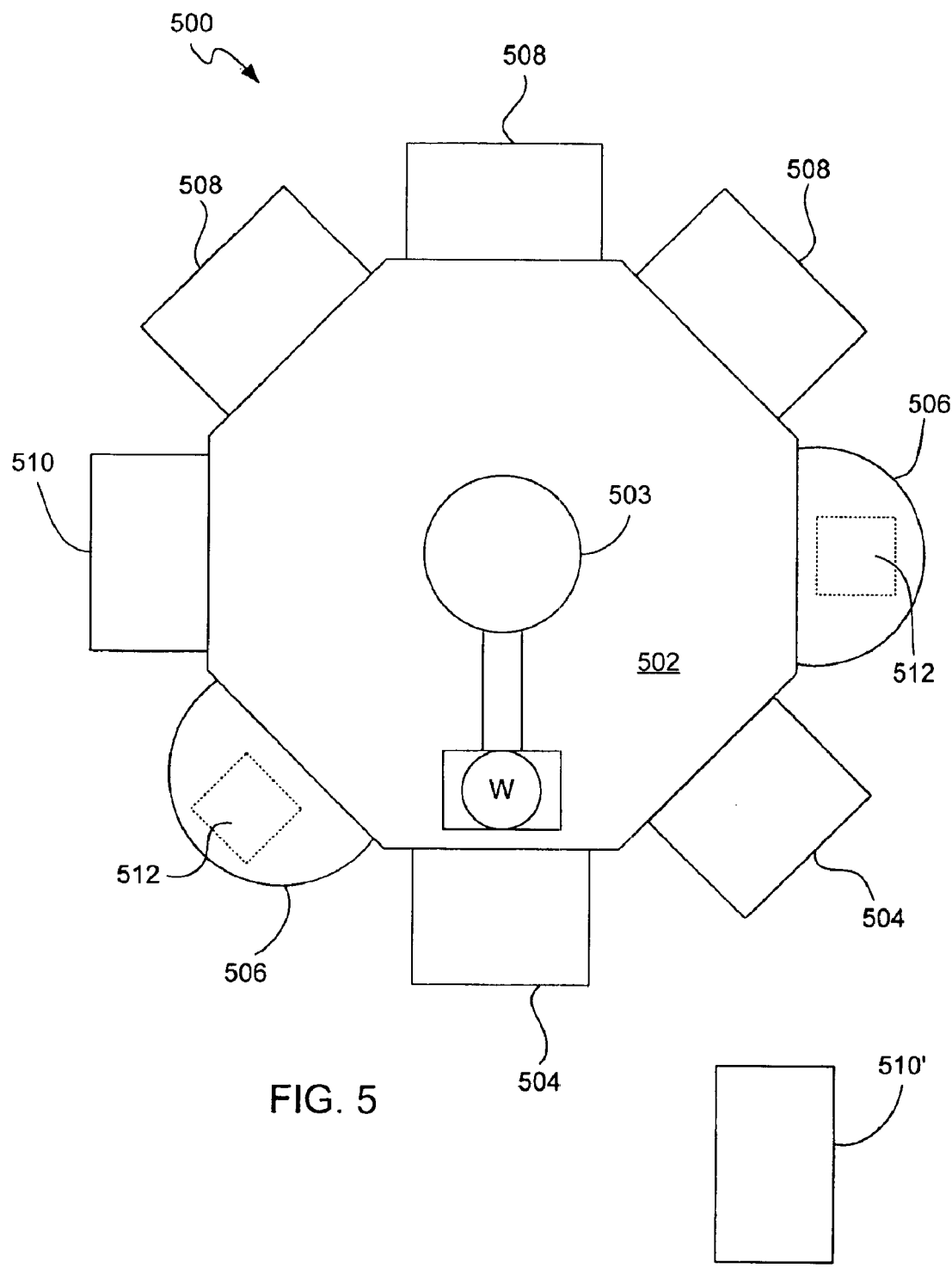
FIG. 5 is a schematic diagram of a multiple cluster tool, in accordance with one embodiment of the present invention.

FIG. 5 is a schematic diagram of a multiple cluster tool 500, in accordance with one embodiment of the present invention. The multiple cluster tool 500 generally includes a transport module 502, load locks 504, aligners 506, and processing modules 508. The transport module 502 is central location where different components used in a processing sequence can be operatively attached, i.e., load locks 504, aligners 506, and processing modules 508. The transport module 502 generally provides an enclosed environment that is under vacuum and that is arranged for transporting or transferring a wafer between the load locks 504, the aligners 506 and the modules 508. In the illustrated embodiment, a transfer robot 503 is used to accomplish the transferring tasks. For example, in a typical sequence, the transfer robot 503 may transfer a wafer W from the load lock 504 to one of the aligners 506, transfer the wafer W from the aligner 506 to one the processing modules 508, and transfer the wafer W from the processing module 508 back to the load lock 502. The transfer robot 503 may also transfer the wafer W between different processing modules or from processing modules to aligners. Transfer modules and transfer robots are generally well known in the art and for the sake of brevity will not be discussed in greater detail herein.

The load locks 504 are generally arranged for receiving a wafer cassette (not shown), which holds a plurality of wafers (e.g., a wafer lot). By way of example, a typical cassette holds between about 1 to about 26 wafers for 200 mm wafers and between about 1 to about 12 for 300 mm wafers. The wafer cassette is used for both incoming and outgoing wafers, i.e., holding wafers before and after processing. In addition, the load locks 504 are arranged for indexing the wafers, which are contained in the wafer cassette. The load locks 504 may also include a vacuum chamber for providing a vacuum environment to the wafers. Moreover, the aligners 506 are generally arranged for aligning and centering the wafer for subsequent processing, as for example, processing that may occur in one or more of the modules 508. Load locks and aligners are generally well known in the art and for the sake of brevity will not be discussed in greater detail herein.

The processing modules 508 are generally arranged for performing processing tasks on a process side of the wafer W. By way of example, the processing modules 508 may be arranged for etching, deposition, patterning, and/or the like.

In one embodiment, the processing modules 508 correspond to the processing module 304 shown and described in FIG. 3. As such, the processing modules 508 generally include a process chamber within which processing takes place, and a chuck for holding and cooling the wafer during the processing task.

In accordance with one embodiment, the multiple cluster tool 500 also includes a cleaning module 510, which is operatively attached to the transport module 502. The cleaning module 510 is arranged for cleaning the backside of the wafer W before loading the wafer into one of the processing modules 508. By way of example, the backside of the wafer may be cleaned using a dry cleaning process, a semi-dry cleaning process, and/or a wet cleaning process. In one embodiment, the cleaning module 510 corresponds to the cleaning module 302 shown and described in FIG. 3. As such, the cleaning module 510 generally includes an applicator for applying a cleaning solution to the backside of the wafer, and a brush for scrubbing the backside of the wafer.

Although the cluster tool 500 is shown as having two load locks, two aligners, three processing modules, and one cleaning module, it should be appreciated that this is not a limitation and that the cluster tool may have more or less of each of these components. For example, some cluster tools may have 8 processing modules and two cleaning modules.

Figure 6:
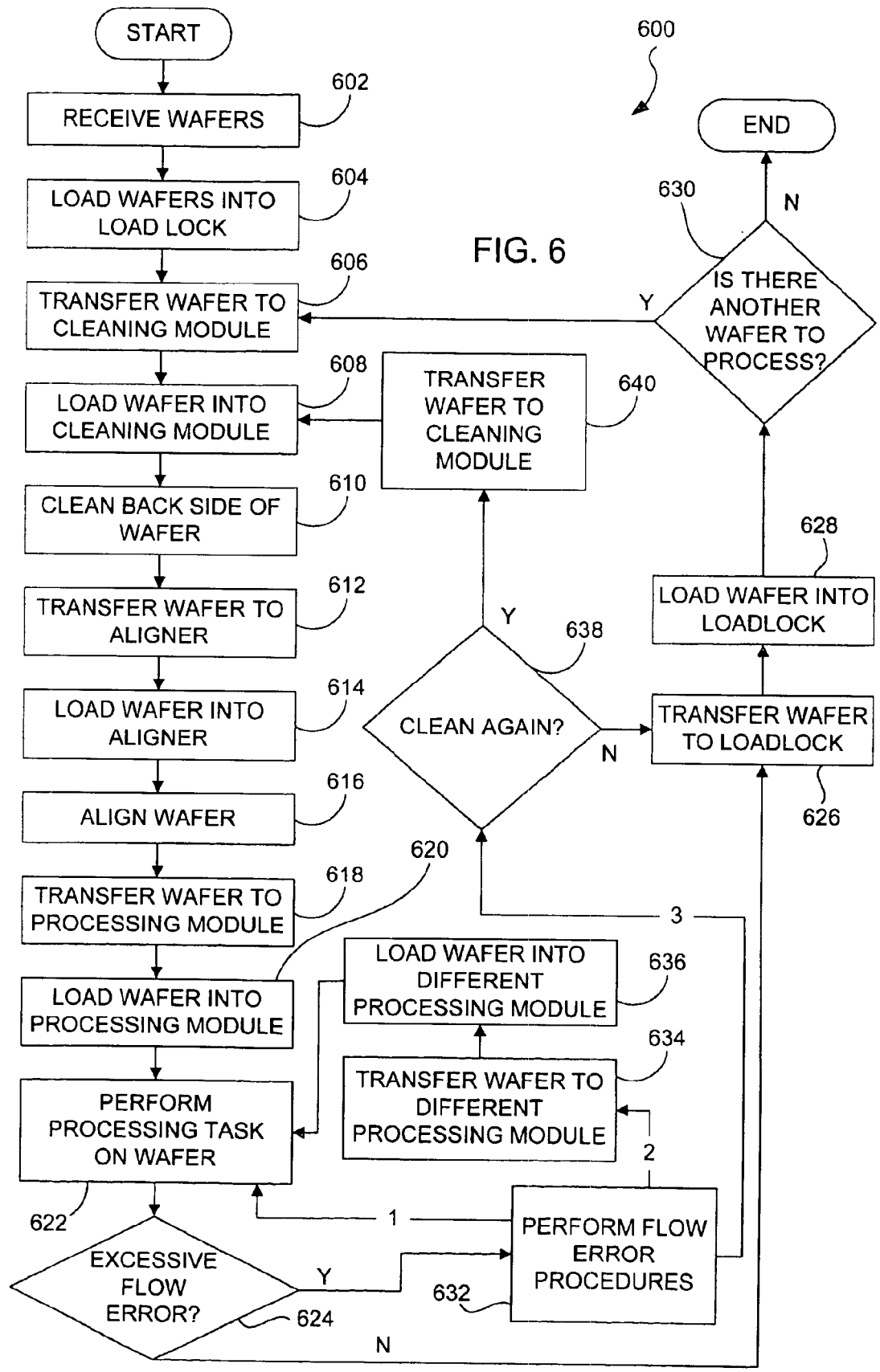
FIG. 6 is a flow diagram showing the operations of the multiple cluster tool of FIG. 5, in accordance with one embodiment of the present invention.

FIG. 6 is a flow diagram 600 showing the operations of the multiple cluster tool 500, in accordance with one embodiment of the present invention. The procedure 600 begins at step 602 where a plurality of wafers are received by an operator or by a machine. The wafers are generally contained in a wafer cassette. The wafers are generally received for the next processing step (e.g., step 622). The wafers may be raw wafers or a previously processed wafers. By definition, a raw wafer is a wafer that has not yet been processed. For example, each of the wafers may have an unprocessed surface on the process side of the wafer. On the other hand, a previously processed wafer is a wafer that has already been processed. For example, each of the wafers may have dielectric layers, conductive layers, masking layers and/or the like formed on the process side of the wafer. Etching, deposition, and/or patterning are some of the methods used for forming layers on the process side of the wafer. As is generally well known, the backside of the wafer, which is opposite the process side of the wafer, is typically left raw. In most cases, the backside of the wafer is arranged for resting on a top surface of a chuck, which is configured for holding the wafer during processing.

After receiving the wafer, the process flow proceeds to step 604 where the wafers are loaded into one of the loadlocks 504. This is typically accomplished via an operator. That is, an operator generally inserts the wafer cassette into the load lock 504. After loading the wafers into the loadlock 504, the process flow proceeds to step 606 where a single wafer W is transferred from the loadlock 504 to the cleaning module 510. This is typically accomplished via the transfer robot 503. That is, the robot moves the wafer W from the load lock to the cleaning module 510. After transferring the wafer, the process flow proceeds to step 608 where the wafers are loaded into the cleaning module 510. Again, this is typically accomplished via the transfer robot 503. By way of example, during this step, the wafer W may be introduced into the cleaning chamber and positioned on the wafer holder of the cleaning module 510.

After loading the wafers, the process flow proceeds to step 610 where the backside of the wafer W is cleaned in the cleaning module 510. As mentioned, the cleaning module 510 is generally arranged for cleaning the backside of the wafer W so as to remove unwanted particles therefrom. The unwanted particles may be dust collected during wafer transfer and/or deposits such as remnants of patterned material or by-products formed during previous processing steps. The unwanted particles typically stick to the backside of the wafer W via static force, molecular bonds and the like. As mentioned, the unwanted particles may cause problems during subsequent processing steps. For example, the unwanted particles may cause the wafer W to be tilted or off set relative to a chuck and thus they may cause He flow errors. In most cases, only the backside is cleaned so as not to damage or contaminate the process side of the wafer. Further, the entire backside of the wafer W may be cleaned or only a portion of the wafer W may be cleaned. By way of example, when the wafer W is cleaned in the cleaning module described in FIG. 3, the brush is positioned against the backside of the wafer W and subsequently rotated relative to the wafer WW while the cleaning solution is flowed between the backside of the wafer W and the brush.

After cleaning the wafers, the process flow proceeds to step 612 where the wafers are unloaded from the cleaning module and transferred to the aligner 506. Again, this is typically accomplished via the transfer robot 503. After transferring the wafer W, the process flow proceeds to step 614 where the wafer W is loaded into the aligner 506. Again, this is typically accomplished via the transfer robot 503. After loading the wafer, the process flow proceeds to step 616 where the wafer W is aligned via the aligner 506. As mentioned, the aligner 506 centers and aligns the wafer W for processing in the processing modules 508.

After aligning the wafer W, the process flow proceeds to step 618 where the wafer W is unloaded from the aligner and transferred to one of the processing modules 508. This is typically accomplished via the transfer robot 503. After transferring the wafer W, the process flow proceeds to step 620 where the wafer W is loaded into the processing module 508. Again, this is typically accomplished via the transfer robot 503. During this step, the wafer W is generally introduced into a process chamber and placed on a chuck. As should be appreciated, by cleaning the backside of the wafer W before placing the wafer W on the chuck, the desired relationship between the backside of the wafer W and the top surface of the chuck can be maintained. That is, the backside of the wafer W may sit flat on the top surface of the chuck without forming gaps therebetween. Subsequently, the chuck via electrostatic, vacuum or mechanical forces clamps the wafer W to the chuck.

After loading the wafer, the process flow proceeds to step 622 where a processing task is performed on the process side of the wafer. By way of example, the processing task may include etching, deposition, patterning and/or the like. If the process task includes deposition, then materials such as conductors and dielectrics are deposited onto the process side of the wafer. If the process task includes etching, then materials such as conductors and dielectrics are removed from predefined areas on the process side of the wafer. If the process task includes patterning, then masking materials such as resists are applied to the process side of the wafer. In the case where the processing module is a plasma reactor, a plasma may be ignited and sustained by supplying a gas containing appropriate etchant or deposition source gases into the process chamber and applying energy to those source gases to respectively etch or deposit a layer of material on the process side of the wafer. As should be appreciated, during this process, the wafer W begins to heat and thus the heat transfer system actively works to cool the wafer W by distributing the heat transfer medium, i.e., He gas, to the backside of the wafer. It should be noted that plasma reactors are not a limitation and that other types of reactors may be used.

During step 622, an He flow fault may be encountered (Step 624). If an excessive flow fault is encountered (Y) then the process flow proceeds to step 632, and if an excessive flow fault is not encountered (N) then the process flow proceeds to step 626. As mentioned, the He flow errors are produced when the flow rate or pressure of the He reaches a predetermined limit as for example when the backside of the wafer W is offset or de-chucked relative to the top surface of the chuck. In most cases, this error is eliminated by cleaning the wafer W in a prior step, however, in some situations some residual particles may still be stuck on the backside or the wafer W may be warped.

Referring first to step 626, after processing the wafer, the wafer W is unloaded from the processing module and transferred to the loadlock 504. This step is typically accomplished via the transfer robot 503. After transferring the wafer, the process flow proceeds to step 628 where the processed wafer W is loaded back into the loadlock 504. Again, this step is typically accomplished via the transfer robot 503. After loading the wafer, the process flow proceeds to step 630 where a determination is made as to whether the entire wafer lot has been processed. If the determination is that each wafer in the lot has been processed then the process flow ends (N). If the determination is that at least one more wafer needs to be processed then the process flow proceeds back to step 606 (Y).

Referring now to step 632, flow error procedures are performed after processing has stopped because of the He flow fault. This particular step generally includes three functions. A first function (1) includes reprocessing the wafer. That is, the processing module is restarted and the processing task is continued. The first function is done to ensure that the flow fault error is indeed correct. If it was an incorrect error, i.e., no other He flow faults are encountered, the processing task is completed and the process flow proceeds to step 626. If, on the other hand, it was a correct error, i.e., another flow fault error is encountered, then the process flow proceeds to the second function (2).

The second function (2) includes reprocessing the wafer W in a different processing module. In the second function (2), therefore, the process flow proceeds to step 634 where the wafer W is unloaded and transferred from a first processing module to a second processing module. This step is generally accomplished via the transfer robot 503. It should be appreciated that this step can only be implemented in multiple cluster tools that have a plurality of the same processing modules, i.e., some tools have a plurality of processing modules that perform different tasks. After transferring the wafer, the process flow proceeds to step 636 where the wafer W is loaded into the second processing module. Again, this step is generally accomplished via the transfer robot 503. During this step, the wafer W is generally introduced into a process chamber and placed on a chuck. After loading the wafer, the process flow proceeds to step 622 where a processing task is performed on the process side of the wafer. The second function is typically done to determine why the flow fault error occurred. If the error occurred because of the chuck, i.e., no He faults are encountered in the new processing module, then the process flow proceeds to step 626. If, on the other hand, the error occurred because of the wafer, i.e., an He flow faults is encountered in the new processing module, then the process flow proceeds to the third function (3). It should be appreciated that if subsequent problems are encountered in the first processing module, i.e., multiple He flow fault errors occur for different wafers, then the first processing module may need to be shut down and the top surface of the chuck cleaned.

The third function (3) includes making a determination as to whether the wafer W should be re-cleaned in step 638. This determination can be made automatically or by inspecting the backside of the wafer. If the determination (Y) is that the wafer W should be cleaned then the process flow proceeds to step 640 where the wafer W is transferred from the second processing module to the cleaning module 510. After transferring the wafer, the process flow proceeds back to step 608 where the wafer W is loaded into the cleaning module 510. If, on the other hand, the determination (N) is that the wafer W should not be cleaned then the process flow proceeds to step 626 where the wafer W is transferred back to the load lock 504 and then subsequently loaded in the load lock 504 (step 628). At the loadlock the wafer W can be removed and visually inspected so as to determine the problem and the solution. For example, if it is determined that an unwanted particle is stuck to the backside of the wafer, then a dry clean process, a semi-dry clean process, and/or a wet clean process can be performed on the wafer. Once cleaned, the wafer W can be loaded back into the load lock 504 so as to continue processing the wafer W. It should be noted that the wet cleaning process is typically more complex and time consuming than the dry and semi-dry cleaning methods. For example, in wet cleaning, the wafer W is dipped (or immersed) in various fluids (acids and/or solvents), which are configured to remove the deposits and therefore clean the backside of the wafer, i.e., chemicals that attack the deposits. Unfortunately, the wafer W must be re-masked after the wet cleaning process, i.e., the entire wafer W is immersed in the fluids. After re-masking, the wafer W may be loaded back into the load lock 504.

In an alternate embodiment and referring back to FIG. 5, the aligner 506 may be integrated with a cleaning mechanism 512 such that it acts like the cleaning module 510 and the aligner 506. The cleaning mechanism 512 generally corresponds to the cleaning mechanism used in cleaning module 510. In this embodiment, the aligner/cleaning mechanism 506/512 typically replaces the cleaning module 510. However, in some cases it may be desirable to include both the cleaning module 510 and the aligner/cleaning mechanism 506/512 in the multiple cluster tool 500. For example, the aligner/cleaning mechanism 506/512 may provide semi-dry cleaning while the cleaning module 510 may provide dry cleaning.

Figure 7:
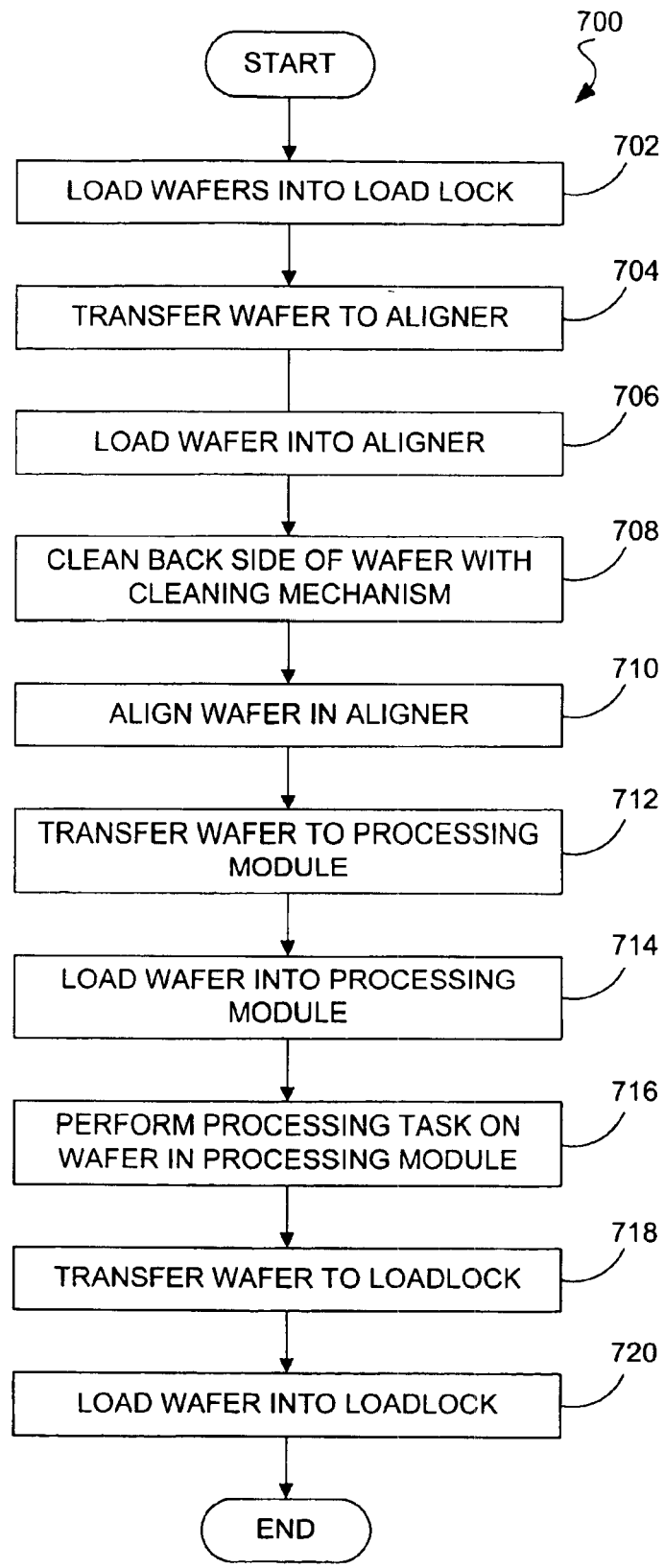
FIG. 7 is a flow diagram showing the operations of the multiple cluster tool of FIG. 5 when an aligner and a cleaning mechanism are integrated with one another, in accordance with one embodiment of the present invention.

To facilitate discussion, FIG. 7 is a flow diagram 700 showing the operations of the multiple cluster tool 500 when the aligner 506 and cleaning mechanism 512 are integrated with one another, in accordance with one embodiment of the present invention. The process flow begins at step 702 where the wafers are loaded into the loadlock 504. This is typically accomplished via an operator. After loading the wafers into the loadlock 504, the process flow proceeds to step 704 where a single wafer W is transferred from the loadlock 504 to the aligner 506. After transferring the wafer W, the process flow proceeds to step 706 where the wafer W is loaded into the aligner 506. After loading the wafer into the aligner 506, the process flow proceeds to step 708 where the backside of the wafer W is cleaned via the cleaning mechanism 512. As mentioned, the cleaning mechanism is arranged to clean the backside of the wafer W so as to remove any unwanted particles therefrom. After cleaning the backside of the wafer W, the process flow proceeds to step 710 where the wafer W is aligned via the aligner 506. As mentioned, the aligner 506 centers the wafer W for processing in the processing modules 508.

After aligning the wafer W, the process flow proceeds to step 712 where the wafer W is transferred from the aligner 506 to one of the processing modules 508. Again, the transferring is typically accomplished via the transfer robot 503. After transferring the wafer, the process flow proceeds to step 714 where the wafer W is loaded into the processing module 508. During this step, the wafer W is generally introduced into a process chamber and placed on a chuck. After loading the wafer W, the process flow proceeds to step 716 where a processing task is performed on the process side of the wafer W. By way of example, the processing task may include etching, deposition, patterning and/or the like. After processing the wafer W, the process flow proceeds to step 718 where the wafer W is transferred from the processing module 508 to the loadlock 504. After transferring the wafer W, the process flow proceeds to step 720 where the wafer W is loaded into to the loadlock 504. As should be appreciated, the process continues from step 704 until each wafer in the wafer cassette (lot) has been processed.

In another alternate embodiment and referring back to FIG. 5, the cleaning module 510 may be separated from the multiple cluster tool 500. In this embodiment, the cleaning module, which is designated 510', is a stand alone tool configured for receiving the wafer cassette. As such, an operator typically loads the wafer cassette into the cleaning module 510' for cleaning and then unloads the wafer cassette for future processing, as for example in the multiple cluster tool 500. This process is not an enclosed process, i.e., the cleaning module is separated, and therefore it may have problems with collecting dust during transfer from the separated cleaning module 510' to the multiple cluster tool 500.

Figure 8:
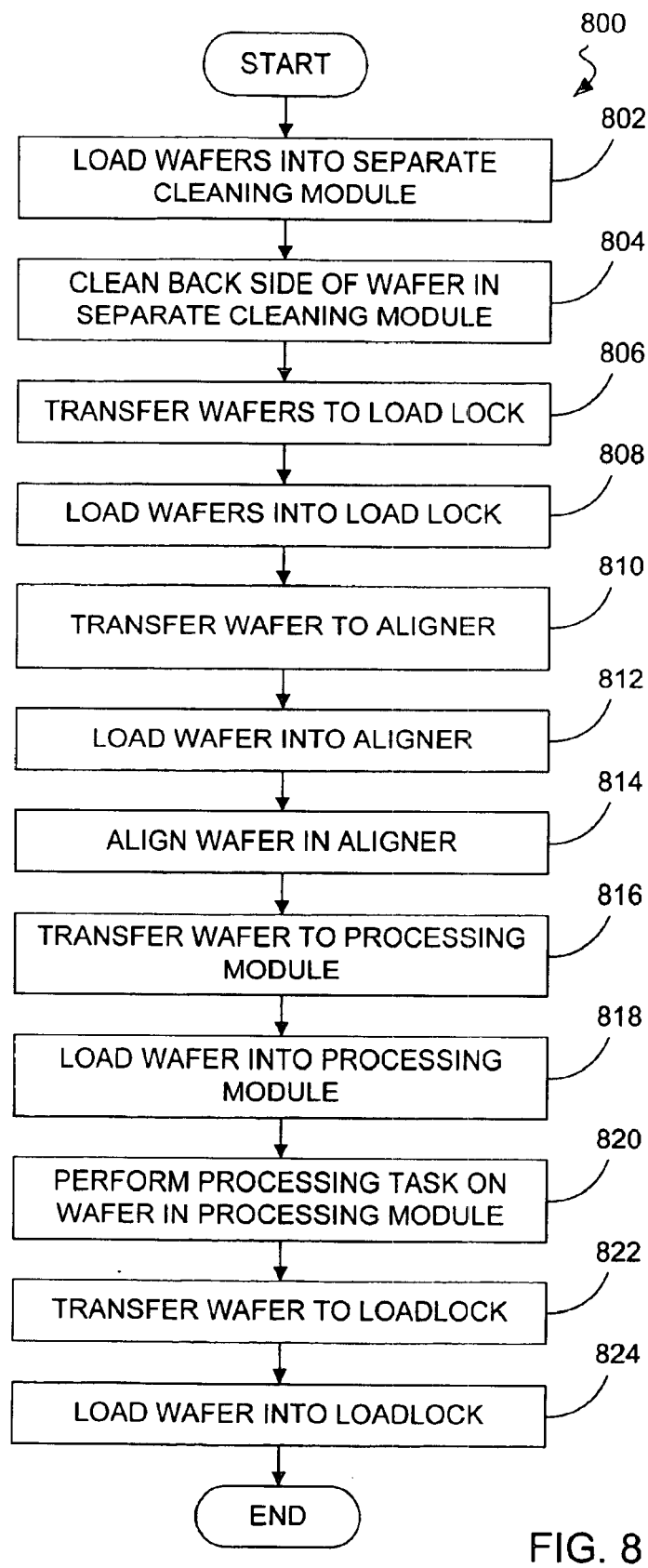
FIG. 8 is a flow diagram showing the operations of cleaning the backside of the wafer in a separated cleaning module and processing the wafer in the multiple cluster tool of FIG. 5, in accordance with one embodiment of the present invention.

To facilitate discussion, FIG. 8 is a flow diagram 800 showing the operations of cleaning the backside of the wafer W in a separated cleaning module and processing the wafer W in the multiple cluster tool 500, in accordance with one embodiment of the present invention. The process flow begins at step 802 where the wafers are loaded into the separated cleaning module 510'. This step is generally accomplished via an operator. After loading the wafers, the process flow proceeds to step 804 where the backside of each of the wafers is cleaned. The separated cleaning module 510' is arranged for removing particles from the backside of each of the wafers.

After cleaning the wafers, the process flow proceeds to step 806 where the wafers are unloaded from the separated cleaning module 510' and transferred to the multiple cluster tool 500. Again, this step is generally accomplished via an operator. After transferring the wafers, the process flow proceeds to step 808 where the wafers are loaded into the loadlock 504. Again, this step is generally accomplished via an operator. After loading the wafers into the loadlock 504, the process flow proceeds to step 810 where a single wafer W is transferred from the loadlock 504 to the aligner 506. In most cases, the transferring is accomplished by the transfer robot 503. After transferring the wafer, the process flow proceeds to step 812 where the wafer is loaded into the aligner 506. The loading is typically accomplished via the transfer robot 503. After loading the wafer W into the aligner 506, the process flow proceeds to step 814 where the wafer W is aligned via the aligner 506. As mentioned, the aligner 506 centers the wafer W for processing in the processing modules 508.

After aligning the wafer W, the process flow proceeds to step 816 where the wafer W is transferred from the aligner 506 to one of the processing modules 508. Again, the transferring is typically accomplished via the transfer robot 503. After transferring the wafer W, the process flow proceeds to step 818 where the wafer W is loaded into the processing module 508. During this step, the wafer W is generally introduced into a process chamber and placed on a chuck. After loading the wafer W, the process flow proceeds to step 820 where a processing task is performed on the process side of the wafer W. By way of example, the processing task may include etching, deposition, patterning and/or the like. After processing the wafer W, the process flow proceeds to step 822 where the wafer W is transferred from the processing module 508 to the loadlock 504. Again, the transferring is typically accomplished via the transfer robot 503. After transferring the wafer W, the process flow proceeds to step 824 where the wafer W is loaded into to the loadlock 504. As should be appreciated, process continues from step 810 until each wafer in the wafer cassette (lot) has been processed.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A system for reducing He backside faults when processing a wafer having a process side and a backside opposite the process side, comprising:

a cleaning module for cleaning the backside of the wafer so as to remove un-wanted particles therefrom before performing subsequent processing tasks on the process side of the wafer, the cleaning module being configured to only clean the backside of the wafer so as not to effect the process side of the wafer, the cleaning module comprising, a cleaning chamber;

an applicator for dispensing a cleaning solution on the back side of the wafer, a brush for scrubbing the backside of the wafer; and a wafer holder for holding the wafer relative to the brush; and a processing module for performing processing tasks on the process side of the wafer the processing module comprising;

a process chamber within which processing takes place; and a chuck for holding the backside of the wafer relative to a top surface of the chuck, the chuck including a heat transfer system for controlling the temperature of the wafer, the heat transfer system being configured for distributing He gas to the backside of the wafer during processing;

a transport module configured to remove the cleaned wafer from the cleaning modules to move the cleaned wafer from the cleaning module to the processing module, and to place the cleaned wafer on the chuck inside the process chamber of the processing module without performing any intervening manipulations during said movement.

2. The system as recited in claim 1 wherein the chuck is selected from a vacuum chuck, a mechanical chuck or an electrostatic chuck.

3. The system as recited in claim 1 wherein the processing module is a plasma reactor for performing an etching task, the plasma reactor having a process chamber within which a plasma is formed for the etching task and a chuck for supporting the wafer during the etching task, wherein the process side of the wafer is etched after placing the wafer on the chuck.

4. The system as recited in claim 1 wherein the processing module is selected from an thing module, a deposition module or a patterning module and wherein the processing task is the next processing task in a sequence of processing steps which include etching, deposition or patterning tasks.

5. A multiple cluster tool, comprising:
   a transport module for moving a substrate between multiple modules;
   an integrated processing module operatively coupled to the transport module, the integrated processing module including a chuck and being arranged to perform a processing task on a top side of the substrate; and
   an integrated cleaning module operatively coupled to the transport module, the integrated cleaning module being arranged to perform cleaning task on a backside of the substrate before loading the wafer into the processing module, the cleaning task including removing un wanted particles from the back side of the substrate without effecting the top side of the substrate, the integrated cleaning module including at least a brush for scrubbing the backside of the wafer, and
   wherein the transport module is adapted to move the substrate from the integrated cleaning module to the integrated processing module and to place the substrate on the chuck and wherein no intervening manipulations are performed during said movement between the cleaning module and the processing module.

6. The tool as recited in claim 3 wherein the integrated processing module is an etching module, and wherein the processing task is the next processing task in a sequence of processing steps which include etching, deposition or patterning tasks.

7. The tool as recited in claim 5 wherein the processing module is a plasma reactor for performing an etching task.

8. The multiple cluster tool as recited in claim 5 wherein the integrated cleaning module further comprises:
   a cleaning chamber;
   an applicator for dispensing a cleaning solution on the back side of the wafer;
   a wafer holder arranged to hold the wafer relative to the brush; and
   a platen arranged for holding the brush relative to the backside of the wafer.

9. The apparatus as recited in claim 8 wherein the wafer holder is configured to hold the wafer against the brush.

10. The apparatus as recited in claim 8 wherein abrasiveness of the brush is configured to remove un-wanted particles while not adversely affecting the backside of the wafer.

11. The apparatus as recited in claim 8 wherein the cleaning solution is an alcohol based solution.

12. The apparatus as recited in claim 8 wherein the applicator is configured to dispense the cleaning solution onto the brush.

13. The apparatus as recited in claim 8 wherein the cleaning Module is adapted to move the brush and the wafer relative to one another to force un-wanted particles off the backside of the wafer.

14. The apparatus as recited in claim 13 wherein the cleaning module is configured to bold the wafer stationary while the brush is moved.

15. The apparatus as recited in claim 8 wherein cleaning module is confided to position the brush against the backside of the wafer, rotate the brush relative to the wafer, and dispense a cleaning solution between the backside of the wafer and the brush.

16. The apparatus as recited in claim 8 wherein the brush is dimensioned to cover the entire backside of the wafer.

17. The apparatus as recited in claim 8 wherein the brush is arranged to move in rotary motion.

18. The tool as recited in claim 5 wherein the integrated processing module is a deposition module and wherein the processing task is the next processing task in a sequence of processing steps which include etching, deposition or patterning tasks.

19. The tool as recited in claim 5 wherein the integrated processing module is a patterning module and wherein the processing task is the next processing task in a sequence of processing steps which include etching, deposition or patterning tasks.

20. The apparatus as recited in claim 8 wherein the platen is configured to hold the brush against the wafer.

21. The apparatus as recited in claim 8 wherein the cleaning solution is a water based solution.

22. The apparatus as recited in claim 8 wherein the applicator is configured to dispense the cleaning solution onto the backside of the wafer.

23. The apparatus as recited in claim 13 wherein the brush is held stationary while the wafer is moved or both the brush and the wafer are moved together.

24. The apparatus as recited in claim 8 wherein the brush is dimensioned to cover only a portion of the backside of the wafer.

25. The apparatus as recited in claim 8 wherein the brush is arranged to move in linear motion.

26. The apparatus as recited in claim 8 wherein the brush is arranged to move in orbital motion.

27. A system for reducing He backside faults when processing a wafer having a process side and a backside opposite the process side, comprising:
   a cleaning module for cleaning the backside of the wafer so as to remove un-wanted particles therefrom before performing subsequent processing tasks on the process side of the wafer, the cleaning module being configured to perform a dry cleaning process, the cleaning module including a process chamber and a gas system for introducing a gaseous cleaning agent into the process chamber, the gaseous cleaning agent chemically reacting with and vaporizing particles on the backside of the wafer;
   a processing module for performing processing tasks on the process side of the wafer after the un-wanted particles have been removed from the backside of the wafer, the processing module being configured to generate a plasma for performing an etching task, the processing module including a process chamber within which the plasma is generated and a chuck for receiving the backside of the wafer and for supporting the wafer during the etching task; and
   a transport module configured to remove the cleaned wafer from the cleaning module, to move the cleaned wafer from the cleaning module to the processing module, and to place the cleaned wafer on the chuck inside the process chamber of the processing module without performing any intervening manipulations during said movement.

* * * * *